United States Patent
Ueno

(10) Patent No.: US 8,508,393 B2
(45) Date of Patent: Aug. 13, 2013

(54) ANALOG-TO-DIGITAL CONVERSION APPARATUS AND SIGNAL PROCESSING SYSTEM

(75) Inventor: Yosuke Ueno, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 13/474,293

(22) Filed: May 17, 2012

(65) Prior Publication Data

US 2012/0306673 A1    Dec. 6, 2012

(30) Foreign Application Priority Data

May 31, 2011   (JP) ................................. 2011-121911

(51) Int. Cl.
*H03M 1/06* (2006.01)

(52) U.S. Cl.
USPC ........... 341/118; 341/120; 341/139; 341/140; 341/155; 341/159

(58) Field of Classification Search
USPC .................. 341/118–121, 139, 140, 155, 159
See application file for complete search history.

(56) References Cited

U.S. PATENT DOCUMENTS

| | | | | |
|---|---|---|---|---|
| 5,610,943 A * | 3/1997 | Kakuishi et al. | ............. | 375/243 |
| 6,653,959 B1 * | 11/2003 | Song | ............................. | 341/131 |
| 6,720,895 B2 * | 4/2004 | Poulton et al. | ................ | 341/120 |
| 7,126,508 B2 * | 10/2006 | Seki | ............................... | 341/118 |
| 7,330,144 B2 * | 2/2008 | Terazawa et al. | ............. | 341/157 |
| 7,479,908 B2 * | 1/2009 | Hirose et al. | .................. | 341/120 |
| 7,782,235 B1 * | 8/2010 | Velazquez | ..................... | 341/118 |
| 7,821,432 B2 * | 10/2010 | Asami et al. | ................... | 341/118 |
| 7,952,502 B2 * | 5/2011 | Kolze et al. | .................... | 341/118 |
| 8,102,289 B2 * | 1/2012 | Oshima et al. | ................. | 341/120 |

FOREIGN PATENT DOCUMENTS

| | | |
|---|---|---|
| JP | 2006-025399 | 1/2006 |
| JP | 2006-135934 | 5/2006 |

* cited by examiner

*Primary Examiner* — Linh Nguyen
(74) *Attorney, Agent, or Firm* — Rader, Fishman & Grauer PLLC

(57) ABSTRACT

An analog-to-digital conversion apparatus includes: a first analog-to-digital converter configured to convert an input analog signal into a digital signal; a second analog-to-digital converter configured to convert an analog signal generated by multiplying the input analog signal by $\alpha$ times with a coefficient $\alpha$ into a digital signal; a first non-linear compensation part configured to compensate a non-linear distortion of a first output signal of the first analog-to-digital converter; a second non-linear compensation part configured to compensate a non-linear distortion of a second output signal of the second analog-to-digital converter; and a non-linear detection part configured to estimate how much the non-linear distortions of the first and second analog-to-digital converters are compensated by the first and second non-linear compensation parts depending on first and second signals by the first and second non-linear compensation parts.

11 Claims, 10 Drawing Sheets

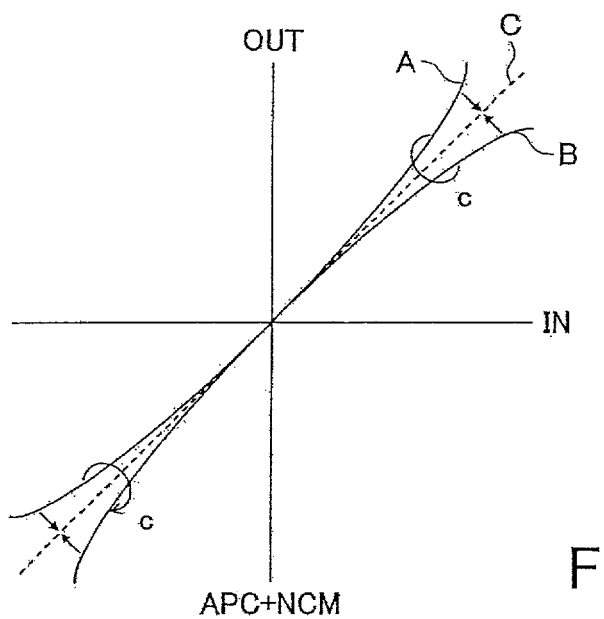
FIG.3
FIG.4A
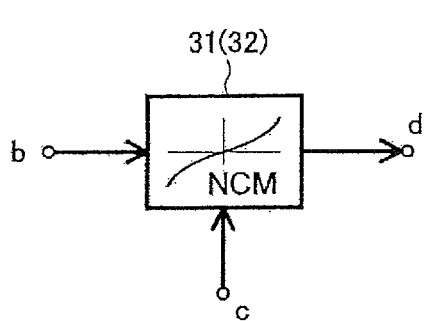
FIG.4B
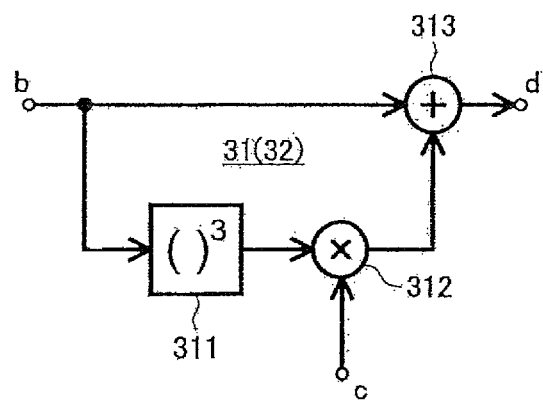
FIG.4

Continuous-time system second-order low-pass Δ Σ modulator

FIG.11A
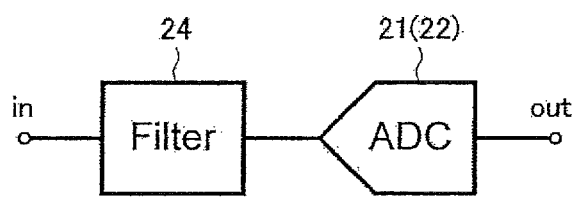
FIG.11B
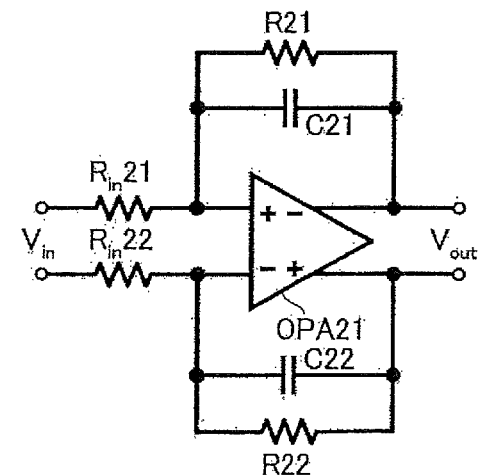
FIG.11

ANALOG-TO-DIGITAL CONVERSION APPARATUS AND SIGNAL PROCESSING SYSTEM

BACKGROUND

The present technology relates to an analog-to-digital (AD) conversion apparatus and a signal processing system that are configured to be applied to a receiver in radio communication, and furthermore an audio device, a medical measuring device, and the like.

FIG. 1 is a diagram showing an outline structure of an AD converter (ADC; Analog-to-Digital Converter).

In FIG. 1, X represents an input voltage of an AD converter 1, and the input voltage X is an analog signal. Meanwhile, Y represents an output voltage of the AD converter 1, and the output voltage Y is a digital signal.

The AD converter 1 generates a distortion caused by non-ideal characteristics of circuit elements used inside. When a circuit has a distortion, the output includes not only fundamental wave components of a signal but also harmonic components.

In the harmonic components, even-order components may have a sufficient attenuation amount with an AD converter having an all-differential structure, but odd-order components appear in the output as they are.

When the AD converter 1 shown in FIG. 1 has distortion characteristics, the output Y with respect to the comparatively small input X is expressed as the following formula 1.

$$Y = a_1 X + a_3 X^3 + a_5 X^5 + \ldots \quad \text{(Formula 1)}$$

In the formula, $a_i$ represents a gain of ith-order distortion components, and an even-order distortion is not assumed to be generated as mentioned above.

SUMMARY

As shown in the formula 1, as an input signal becomes larger, distortion components increase at a higher increasing rate.

Therefore, in order to improve distortion characteristics, an input signal is limited to be small in related art. In other words, an AD converter has a dynamic range limited by a distortion.

It is desirable to provide an AD conversion apparatus and a signal processing system that are capable of significantly improving AD conversion characteristics in which a dynamic range is limited by a distortion.

An analog-to-digital conversion apparatus according to a first embodiment of the present technology includes: a first analog-to-digital converter configured to convert an input analog signal into a digital signal; a second analog-to-digital converter configured to convert an analog signal generated by multiplying the input analog signal by $\alpha$ times with a coefficient $\alpha$ into a digital signal; a first non-linear compensation part configured to compensate a non-linear distortion of a first output signal of the first analog-to-digital converter depending on a control variable signal to be supplied; a second non-linear compensation part configured to compensate a non-linear distortion of a second output signal of the second analog-to-digital converter depending on the control variable signal to be supplied; and a non-linear detection part configured to estimate how much the non-linear distortion of the first analog-to-digital converter and that of the second analog-to-digital converter are compensated by the first non-linear compensation part and the second non-linear compensation part depending on a first signal by the first non-linear compensation part and a second signal by the second non-linear compensation part, the non-linear detection part being configured to estimate a curvature that depends on a signal intensity of the input analog signal on the basis of a ratio of a change generated by the first signal and the second signal with a non-linear distortion as the curvature and generate the control variable signal to negate the curvature portion to thereby output the control variable signal to the first non-linear compensation part and the second non-linear compensation part.

A signal processing system according to a second embodiment of the present technology includes an analog-to-digital conversion apparatus configured to convert an analog signal from an analog signal processing system into a digital signal, the analog-to-digital conversion apparatus including a first analog-to-digital converter configured to convert an input analog signal into a digital signal, a second analog-to-digital converter configured to convert an analog signal generated by multiplying the input analog signal by $\alpha$ times with a coefficient $\alpha$ into a digital signal, a first non-linear compensation part configured to compensate a non-linear distortion of a first output signal of the first analog-to-digital converter depending on a control variable signal to be supplied, a second non-linear compensation part configured to compensate a non-linear distortion of a second output signal of the second analog-to-digital converter depending on the control variable signal to be supplied, and a non-linear detection part configured to estimate how much the non-linear distortion of the first analog-to-digital converter and that of the second analog-to-digital converter are compensated by the first non-linear compensation part and the second non-linear compensation part depending on a first signal by the first non-linear compensation part and a second signal by the second non-linear compensation part, the non-linear detection part being configured to estimate a curvature that depends on a signal intensity of the input analog signal on the basis of a ratio of a change generated by the first signal and the second signal with a non-linear distortion as the curvature and generate the control variable signal to negate the curvature portion to thereby output the control variable signal to the first non-linear compensation part and the second non-linear compensation part.

According to the present technology, AD conversion characteristics in which a dynamic range is limited by a distortion may significantly improve.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 3 is a diagram explaining a concept of non-linear compensation in a non-linear compensation part according to the embodiment;

FIG. 4 are diagrams showing a structure example of a non-linear compensator according to the embodiment;

FIG. 11 are diagrams showing a structure example of an input part of a ΔΣ modulator according to the third embodiment;

DETAILED DESCRIPTION OF EMBODIMENTS

Hereinafter, embodiments of the present technology will be described with reference to the drawings.

An explanation will be given in the following order.

1. First embodiment (first structure example of AD conversion apparatus that includes distortion compensation function)

2. Second embodiment (second structure example of AD conversion apparatus that includes distortion compensation function)

3. Third embodiment (third structure example of AD conversion apparatus that includes distortion compensation function)

4. Fourth embodiment (fourth structure example of AD conversion apparatus that includes distortion compensation function)

5. Fifth embodiment (structure example of signal processing system)

1. First Embodiment

Figure 1:
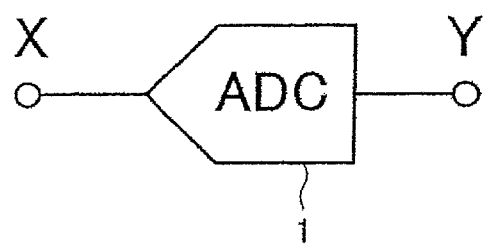
FIG. 1 is a diagram showing an outline structure of an AD converter (ADC)
Figure 2:
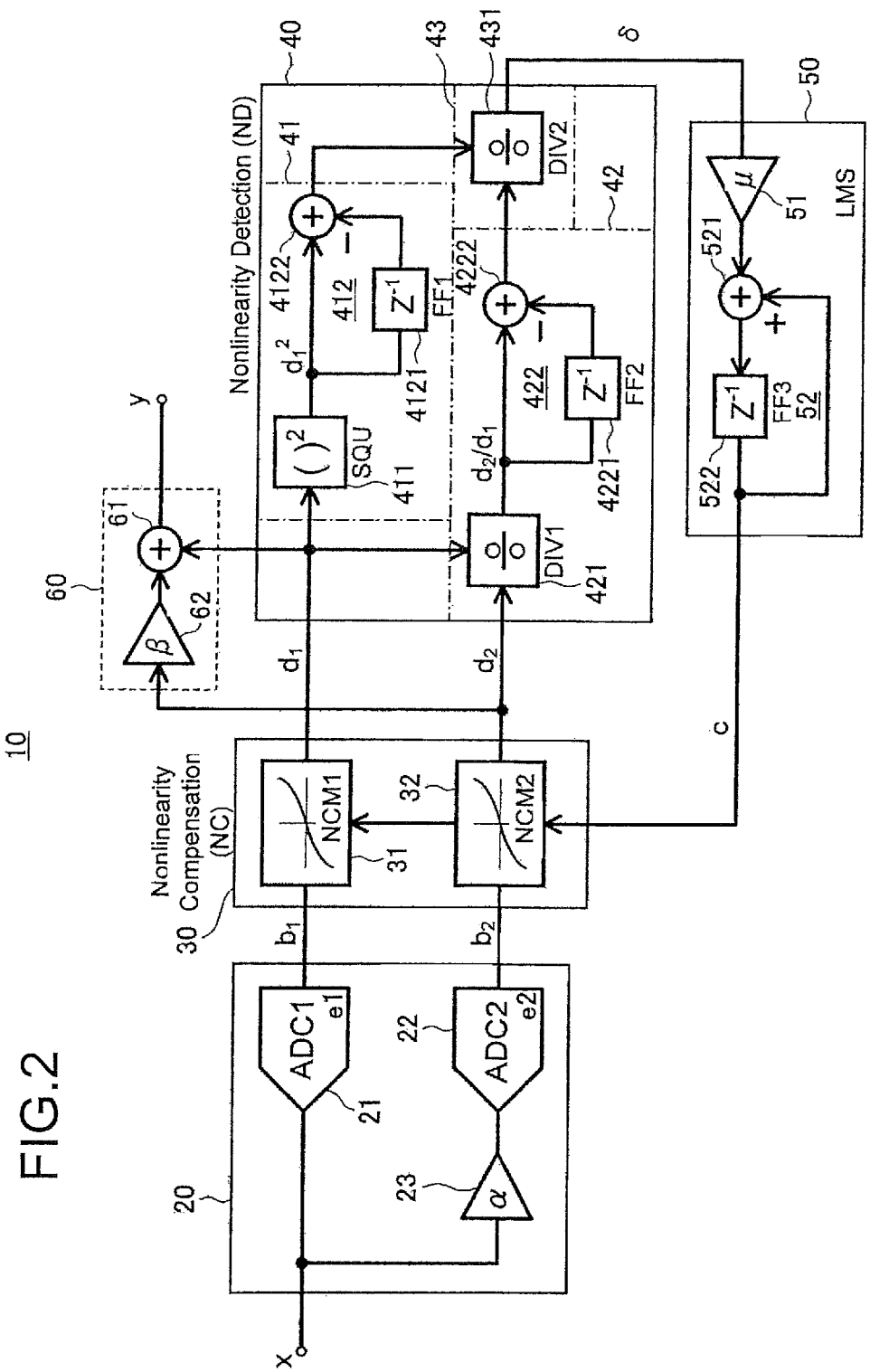
FIG. 2 is a diagram showing a structure of an AD conversion apparatus that includes a non-linear (distortion) compensation function according to a first embodiment.

FIG. 2 is a diagram showing a structure of an AD conversion apparatus that includes a non-linear (distortion) compensation function according to the first embodiment.

An AD conversion apparatus 10 according to the first embodiment includes, as shown in FIG. 2, an AD conversion part 20, a non-linear compensation part 30, a non-linear detection part 40, a filter 50, and an output part 60.

In FIG. 2, x represents an input voltage of the AD conversion apparatus 10, and the input voltage x is an analog signal. Meanwhile, y represents an output voltage of the AD conversion apparatus 10, and the output voltage y is a digital signal.

The AD conversion part 20 includes a first AD converter (ADC1) 21, a second AD converter (ADC2) 22, and a gain imparting circuit 23.

The gain imparting circuit 23 may be arranged in an input part of the second AD converter 22.

In this embodiment, the first AD converter 21 and the second AD converter 22 apply AD converters having completely the same characteristics. Here, $e_1$ and $e_2$ represent noises generated in the first AD converter 21 and the second AD converter 22, respectively.

The gain imparting circuit 23 configured to multiple a gain (coefficient) α (0<α<1) is arranged on an input side of the second AD converter 22. The gain imparting circuit 23 is provided as an analog circuit.

In this embodiment, the input analog signal x is input to the first AD converter 21 as it is, and a signal generated by multiplying the input signal x by a gain (coefficient) α is input to the second AD converter 22.

A first output signal (digital signal) $b_1$ of the first AD converter 21 and a second output signal (digital signal) $b_2$ of the second AD converter 22 are input to the non-linear compensation part 30.

The non-linear compensation part 30 includes a first non-linear compensator (NCM1) 31 and a second non-linear compensator (NCM2) 32.

The first non-linear compensator 31 compensates a non-linear distortion of the first output signal $b_1$ of the first AD converter 21 depending on a control variable signal c supplied from the filter 50 and outputs the result to the non-linear detection part 40 and the output part 60 as a first signal $d_1$.

The second non-linear compensator 32 compensates a non-linear distortion of the second output signal $b_2$ of the second AD converter 22 depending on the control variable signal c supplied from the filter 50 and outputs the result to the non-linear detection part 40 and the output part 60 as a second signal $d_2$.

FIG. 3 is a diagram explaining a concept of non-linear compensation in a non-linear compensation part according to the embodiment.

In FIG. 3, a horizontal axis represents input, and a vertical axis represents output.

The first non-linear compensator 31 and the second non-linear compensator 32 compensate, as shown in FIG. 3 with solid lines A and B, a non-linear portion in which transmission characteristics between input and output have a linear distortion depending on the control variable signal c so as to converge on a line C shown in the figure with a dashed line.

In this embodiment, the non-linear portion having a non-linear distortion is handled as a portion having a curvature. Therefore, the non-linear compensation part 30 performs compensation processing so that a curvature becomes 0 (approaches 0) depending on the control variable signal c.

The non-linear detection part 40 inputs the first signal $d_1$ by the first non-linear compensator 31 and the second signal $d_2$ by the second non-linear compensator 32.

The non-linear detection part 40 has a function configured to estimate how much a non-linear distortion of the first AD converter 21 and that of the second AD converter 22 are compensated by the first non-linear compensator 31 and the second non-linear compensator 32 depending on the first signal $d_1$ and the second signal $d_2$.

The non-linear detection part 40 estimates a curvature that depends on a signal intensity of an input analog signal on the basis of a ratio of a change generated by the first signal $d_1$ and the second signal $d_2$ with a non-linear distortion as the curvature and generates a control variable signal 5 so as to negate the curvature portion to output the signal to the filter 50.

The non-linear detection part 40 includes an intensity acquisition part 41, a curvature acquisition part 42, and a control variable generation part 43.

The intensity acquisition part 41 calculates a signal intensity of the input analog signal x on the basis of the first signal $d_1$.

More specifically, the intensity acquisition part 41 includes an absolute value acquisition part 411 and a first differentiator 412.

The absolute value acquisition part 411 squares the first signal $d_1$ to acquire an absolute value signal $[d_n{}^2]$ of the first signal $d_1$ and outputs the absolute value signal $[d_n{}^2]$ to the first differentiator 412.

The first differentiator 412 differentiates the absolute value signal $[d_1{}^2]$ acquired by the absolute value acquisition part 411 to acquire a signal intensity $[d_n{}^2-d_{n-1}{}^2]$ of the input analog signal and outputs the signal intensity $[d_n{}^2-d_{n-1}{}^2]$ to the control variable generation part 43.

The first differentiator 412 includes a flip-flop 4121 configured to latch the absolute value signal $[d_{n-1}{}^2]$ in a previous time (n−1), and a subtractor (adder) 4122 configured to subtract the latched absolute value signal $[d_{n-1}{}^2]$ in the previous time (n−1) from the absolute value signal $[d_n{}^2]$ in this time (n).

The curvature acquisition part 42 acquires a curvature that depends on a signal intensity of the input analog signal x on the basis of a ratio of a change generated by dividing the second signal $d_2$ by the first signal $d_1$. In other words, the curvature acquisition part 42 acquires a signal intensity including curvature components that depend on a signal intensity of the input analog signal x on the basis of a ratio of a change generated by dividing the second signal $d_2$ by the first signal $d_1$.

More specifically, the curvature acquisition part 42 includes a first divider 421 and a second differentiator 422.

The first divider 421 acquires a variable ratio signal $[d_2/d_1]_{[n]}$ generated by dividing the second signal $d_2$ by the first signal $d_1$ and outputs the variable ratio signal $[d_2/d_1]_{[n]}$ to the second differentiator 422.

The second differentiator 422 differentiates the variable ratio signal $[d_2/d_1]_{[n]}$ output by the first divider 421 and acquires a curvature signal $\{[d_2/d_1]_{[n]}-[d_2/d_1]_{[n-1]}\}$ including curvature components that depend on a signal intensity. The second differentiator 422 outputs the curvature signal $\{[d_2/d_1]_{[n]}-[d_2/d_1]_{[n-1]}\}$ to the control variable generation part 43.

The second differentiator 422 includes a flip-flop 4221 configured to latch the variable ratio signal $[d_2/d_1]_{[n-1]}$ in a previous time (n−1). The second differentiator 422 includes a subtractor (adder) 4222 configured to subtract the latched variable ratio signal $[d_2/d_1]_{[n-1]}$ in the previous time (n−1) from the variable ratio signal $[d_2/d_1]_{[n]}$ in this time (n).

The control variable generation part 43 generates the control variable signal 5 from which noise components are not yet removed depending on a curvature acquired by the curvature acquisition part 42 and a signal intensity acquired by the intensity acquisition part 41, and outputs the control variable signal δ to the filter 50.

The control variable generation part 43 includes a second divider 431.

The second divider 431 divides the curvature signal $\{[d_2/d_1]_{[n]}-[d_2/d_1]_{[n-1]}\}$ acquired by the second differentiator 422 of the curvature acquisition part 42 by the signal intensity $[d_n{}^2-d_{n-1}{}^2]$ output by the first differentiator 412 of the intensity acquisition part 41 to generate the control variable signal δ.

The filter 50 performs filtering processing on the control variable signal δ output from the non-linear detection part 40 and supplies the signal to the first non-linear compensator 31 and the second non-linear compensator 32 of the non-linear compensation part 30 as the control variable signal c that does not depend on noise.

The filter 50 includes a coefficient imparting part 51 and an integrator 52.

The coefficient imparting part 51 multiplies the control variable signal δ output from the non-linear detection part 40 by a filter coefficient μ and outputs the signal μδ to the integrator 52.

The integrator 52 integrates the signal μδ to generate the control variable signal c from which quantization noise and the like are removed.

The integrator 52 includes an adder 521 configured to add the signal μδ and the generated control variable signal c, and a flip-flop 522 configured to latch an output signal of the adder 521.

The output part 60 basically includes an adder 61, and adds the first signal $d_1$ by the first non-linear compensator 31 and the second signal $d_2$ by the second non-linear compensator 32 to output the signal.

In this embodiment, the output part 60 further includes a coefficient imparting part 62, and adds a signal generated by multiplying the second signal $d_2$ by the second non-linear compensator 32 by β times with a weight coefficient β and the first signal $d_1$ to output the addition signal $(d_1+\beta d_2)$ as a digital signal y.

Hereinafter, a description will be given of a more detailed operation principle of non-linear compensation processing in the AD conversion apparatus 10 having the above-mentioned structure. Also, the coefficients α and β will be examined.

In the AD conversion apparatus 10, the input analog signal x is input to the first AD converter 21 as it is, and a signal generated by multiplying the analog signal x by a gain (coefficient) α (0<α<1) in the gain imparting circuit 23 is input to the second AD converter 22.

The first output signal (digital signal) $b_1$ is input from the first AD converter 21 to the first non-linear compensator 31. The second output signal (digital signal) $b_2$ of the second AD converter 22 is input to the second non-linear compensator 32.

In the first non-linear compensator 31, a non-linear distortion of the first output signal $b_1$ of the first AD converter 21 is compensated depending on the control variable signal c supplied from the filter 50, and the result is output to the non-linear detection part 40 and the output part 60 as the first signal $d_1$.

In the second non-linear compensator 32, a non-linear distortion of the second output signal $b_2$ of the second AD converter 22 is compensated depending on the control variable signal c supplied from the filter 50, and the result is output to the non-linear detection part 40 and the output part 60 as the second signal $d_2$.

In the output part 60, the first signal $d_1$ is added to a signal generated by multiplying the second signal $d_2$ by the weight coefficient β, and the addition signal shown in the following formula 2 is output as the output digital signal y of a whole system.

$$y=d_1+\beta \cdot d_2 \qquad \text{(Formula 2)}$$

The first signal $d_1$ and the second signal $d_2$ output from the non-linear compensation part 30 are also input to the non-linear detection part 40 simultaneously in parallel.

In the non-linear detection part 40, a curvature that depends on a signal intensity of an input analog signal is estimated on the basis of a ratio of a change generated by the first signal $d_1$ and the second signal $d_2$ with a non-linear distortion as the curvature, and the control variable signal δ is generated so as to negate the curvature portion.

In the non-linear detection part 40, in order to generate the control variable signal δ, calculation shown in a formula 3 is respectively performed on the first signal $d_1$ and the second signal $d_2$ that have been input, to thereby generate the control variable signal δ from which noise is not yet removed.

$$\delta[n] = \frac{\left.\frac{d_2}{d_1}\right|_{[n]} - \left.\frac{d_2}{d_1}\right|_{[n-1]}}{d_1^2[n] - d_1^2[n-1]} \quad \text{(Formula 3)}$$

By the calculation, the non-linear detection part 40 estimates how correctly non-linear characteristics of the first AD converter 21 and the second AD converter 22 are compensated by the first non-linear compensator 31 and the second non-linear compensator 32 of the non-linear compensation part 30.

Also, in order to remove random noise and quantization error generated from the AD converters, the control variable signal 5 is input to the least minimum square (LMS) filter 50.

In the filter 50, as shown in a formula 4, the signal is output as the control variable signal c that has been integrated (cumulated) with weighting of the constant coefficient μ and filtered.

$$c[n] = \mu \cdot \sum_{k=0}^{n} \delta[k] \quad \text{(Formula 4)}$$

The control variable signal c is input to the first non-linear compensator 31 and the second non-linear compensator 32 of the non-linear compensation part 30 as feedback, and varies the non-linear characteristics depending on the variable.

[A Non-Linear Compensation Part]

FIGS. 4A and 4B are diagrams showing a structure example of a non-linear compensator according to the embodiment.

FIG. 4A shows a conceptual structure of a non-linear compensator, and FIG. 4B shows a structure example of a non-linear compensator.

A description will be given of a structure example of the first non-linear compensator 31. The second non-linear compensator 32 has a similar structure to that of the first non-linear compensator 31.

The non-linear compensator 31 includes a cuber 311, a multiplier 312, and an adder 313.

The non-linear compensator 31 cubes the input signal $b_1$ and adds a signal generated by multiplying the cube signal by the control variable c to the input signal $b_1$ to output the first signal $d_1$.

Similarly, the non-linear compensator 32 cubes the input signal $b_2$ and adds a signal generated by multiplying the cube signal by the control variable c to the input signal $b_2$ to output the second signal $d_2$.

That is, the non-linear compensator is configured to perform processing similar to the processing in a formula 5.

$$d = b + c \cdot b^3 \quad \text{(Formula 5)}$$

Hereinafter, a description will be given to show that this may compensate non-linear characteristics of an AD converter.

Figure 5:
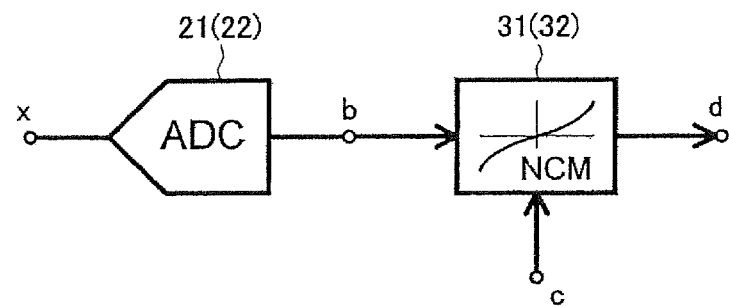
FIG. 5 is a diagram showing a structure in which the AD converter (ADC) and the non-linear compensator (NCM) according to the embodiment are connected to each other.

FIG. 5 is a diagram showing a system in which the AD converter (ADC) and the non-linear compensator (NCM) according to the embodiment are connected to each other.

As shown in FIG. 5, consideration will be given of a system in which the AD converter 21 (22) and the non-linear compensator 31 (32) are connected to each other.

Since characteristics of the AD converter and the non-linear compensator are respectively expressed as the formula 1 and the formula 5, the output d of the system is given by approximation that focuses on a tertiary distortion as the following formula 6.

$$d \cong (a_1 b + a_3 b^3) + c \cdot (a_1 b + a_3 b^3)^3 \cong a_1 b + (a_3 + c \cdot a_1^3) \cdot b^3 \quad \text{(Formula 6)}$$

Therefore, when the control variable c of the non-linear compensator is set to be correct, which means set to be as shown in the following formula 7, distortion components vanish from the output d of the system by the formula 6.

$$c = -\frac{a_3}{a_1^3} \quad \text{(Formula 7)}$$

It shows that the non-linear compensator may compensate a distortion of the AD converter.

Practically, as shown in the formula 1, a higher-order distortion exists in the AD converter, and the non-linear compensator may also cause a high-order distortion.

Therefore, as the result, an optimal value of the control variable c of the non-linear compensator to compensate a distortion as much as possible varies a little from the formula 7, but even in such a case, an optimal value capable of compensating most parts of the distortion exists.

[A Non-Linear Detection Part]

As shown in the formula 1, a distortion is a curvature associated with input/output characteristics.

In the non-linear detection part 40, the curvature is estimated and fed back by the formula 3 so that the curvature of the system in which the AD converter and the non-linear compensator are connected to each other converges on 0.

A relationship in the following formula 8 is acquired by substituting the formula 1 that shows characteristics of the AD converter and the formula 5 that shows characteristics of the non-linear compensator into the formula 3 that is for calculation in the non-linear detection part 40.

$$d_1 \cong a_1 x + (a_3 + c \cdot a_1^3) \cdot x^3$$

$$d_2 \cong \alpha \cdot a_1 x + \alpha^3 \cdot (a_3 + c \cdot a_1^3) \cdot x^3 \quad \text{(Formula 8)}$$

A relationship in a formula 9 is acquired from the formula 8.

$$\delta[n] = \frac{\left.\frac{d_2}{d_1}\right|_{[n]} - \left.\frac{d_2}{d_1}\right|_{[n-1]}}{d_1^2[n] - d_1^2[n-1]} \cong -\frac{\alpha(1-\alpha^2)}{a_1^3} \cdot (a_3 + c \cdot a_1^3) \quad \text{(Formula 9)}$$

Therefore, when the control variable signal δ converges on 0 by feedback, a relationship in a formula 10 is acquired from the formula 9.

$$c = -\frac{a_3}{a_1^3} \quad \text{(Formula 10)}$$

It is the same as the formula 7, which means when the output δ of the non-linear detection part 40 converges on 0, the non-linear compensators (NCM1 and NCM2) 31 and 32 compensate AD converters (ADC1 and ADC2) 21 and 22.

As already mentioned, practically a higher-order distortion exists in the AD converter, and the non-linear compensator may also cause a high-order distortion. Therefore, the formula 9 itself is not so accurate, but the control variable c of the non-linear compensator configured to minimize a total amount of a distortion exists and the non-linear detection part 40 helps the control variable c converge on the optimal value by minimizing a curvature.

[Noise Inside ADC (Quantization Noise and Circuit Noise)]

A description will be given of noise inside an AD converter and removal processing thereof.

Figure 6:
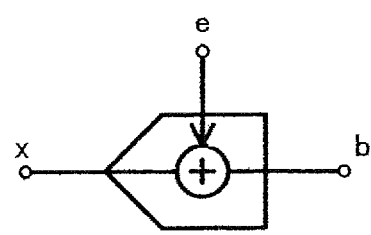
FIG. 6 is a diagram explaining noise (quantization noise and circuit noise) inside an AD conversion apparatus.

FIG. 6 is a diagram explaining noise inside an AD converter (quantization noise and circuit noise).

Though noise is ignored in the formula 1 and the formula 8 that show transmission characteristics of an AD converter, various types of noise (quantization noise and circuit noise) are also injected into an actual AD converter, as shown in FIG. 6.

The control variable signal 5 that is an output of the non-linear detection part 40 is input to the LMS filter 50 as a filter to help the control variable signal c converge without dependence on such a random noise. When the LMS filter coefficient μ is increased, the control variable signal c converges at high speed. On the other hand, however, the above-mentioned various types of noise are added to the control variable c, with the result that AD conversion accuracy deteriorates.

When the filter coefficient μ is reduced, the various types of noise are filtered sufficiently enough not to be added to the control variable c, but it takes a long time for the control variable c to converge.

[Optimal Value of α]

Consideration will be given of an optimal value of the gain coefficient α that is imparted to the input analog signal x by the gain imparting circuit 23.

In the formula 9, when a coefficient determined by α is defined as a formula 11, a relationship in a formula 12 is acquired.

$$f(\alpha) \equiv \alpha(1-\alpha^2) \quad \text{(Formula 11)}$$

$$\frac{d}{d\alpha}f(\alpha) = -1 + 3\alpha^2 = 0 \Rightarrow \alpha = \frac{1}{\sqrt{3}} \cong 0.588 \quad \text{(Formula 12)}$$

It shows that a coefficient in the formula 9 is maximized, when α is about 0.588.

The formula 9 shows an amount indicating a matching degree of non-linear compensation, and as mentioned above, a constant amount of noise is practically added to that amount. Therefore, in consideration of a signal-to-noise ratio of the control variable signal δ as a non-linear compensation detection signal, it is favorable to set a to be close to the optimal value.

In addition to that, when consideration is given of a mounting method of an analog circuit, a formula 13 is considered to be practically the most favorable.

$$\alpha = 0.5 \quad \text{(Formula 13)}$$

[Optimal Value of β]

Consideration will be given of the coefficient β that is imparted to the second signal $d_2$ in the output part 60.

When noise in each of the AD converters (ADC1 and ADC2) is considered, as shown in FIG. 6, an output of a system having a structure in FIG. 2 is given as a formula 14.

$$y = +d_1 + \beta \cdot d_2 = a_1(1+\beta \cdot \alpha)x + (e_1 + \beta \cdot e_2) \quad \text{(Formula 14)}$$

A signal-to-noise ratio (SNR) of the signal is expressed as a formula 15.

$$SNR = \frac{1+\beta \cdot \alpha}{\sqrt{1+\beta^2}} \cdot \left|\frac{a_1 x}{e}\right| \quad \text{(Formula 15)}$$

When the coefficient is defined as a formula 16, an SNR of the system is maximized with β being equivalent to α, as expressed in a formula 17.

$$g(\beta) \equiv \frac{1+\beta \cdot \alpha}{\sqrt{1+\beta^2}} \quad \text{(Formula 16)}$$

$$\frac{d}{d\beta}g(\beta) = \frac{\alpha - \beta}{(1+\beta^2)^{1.5}} = 0 \Rightarrow \beta = \alpha, \quad \text{(Formula 17)}$$

$$g(\beta = \alpha) = \sqrt{1+\alpha^2}$$

As shown in the formula 13, an optimal value of α is practically 0.5. Therefore, an optimal value of β is also 0.5, which is the most favorable when a digital circuit is implemented.

Since β is implemented in digital signal processing while α is implemented in an analog circuit, the equality therebetween is technically not established. The sensitivity of SNR deterioration is, however, too small to be a problem.

As described above, the AD conversion apparatus 10 according to the first embodiment includes two AD converters that have the same distortion components generated in AD converters to be applied to a receiver in radio communication and furthermore an audio device, a medical measuring device, and the like.

The AD conversion apparatus 10 includes the circuit 23 configured to multiply inputs of the respective AD converters 21 and 22 by appropriate coefficients in a preceding stage of the AD converter 22.

In the AD conversion apparatus 10, a digital signal processing part that includes the non-linear compensation part 30, the non-linear detection part 40, the least minimum square filter 50, and the output part 60 is arranged in a subsequent stage of the AD converters 21 and 22.

With the AD conversion apparatus 10 having the above-mentioned structure according to the embodiment, characteristics of an AD converter in which a dynamic range is limited by a distortion may significantly improve.

The technology especially validates in a design of an AD converter in low power supply voltage.

[Embodiment Example of Constant Gain α]

The structure of the present technology (FIG. 2) does not depend on a structure of an AD converter itself. Depending on a structure of an AD converter, however, a structure in which an optimal constant gain α is imparted is different. An embodiment example of such a structure will be described.

2. Second Embodiment

Figure 7:
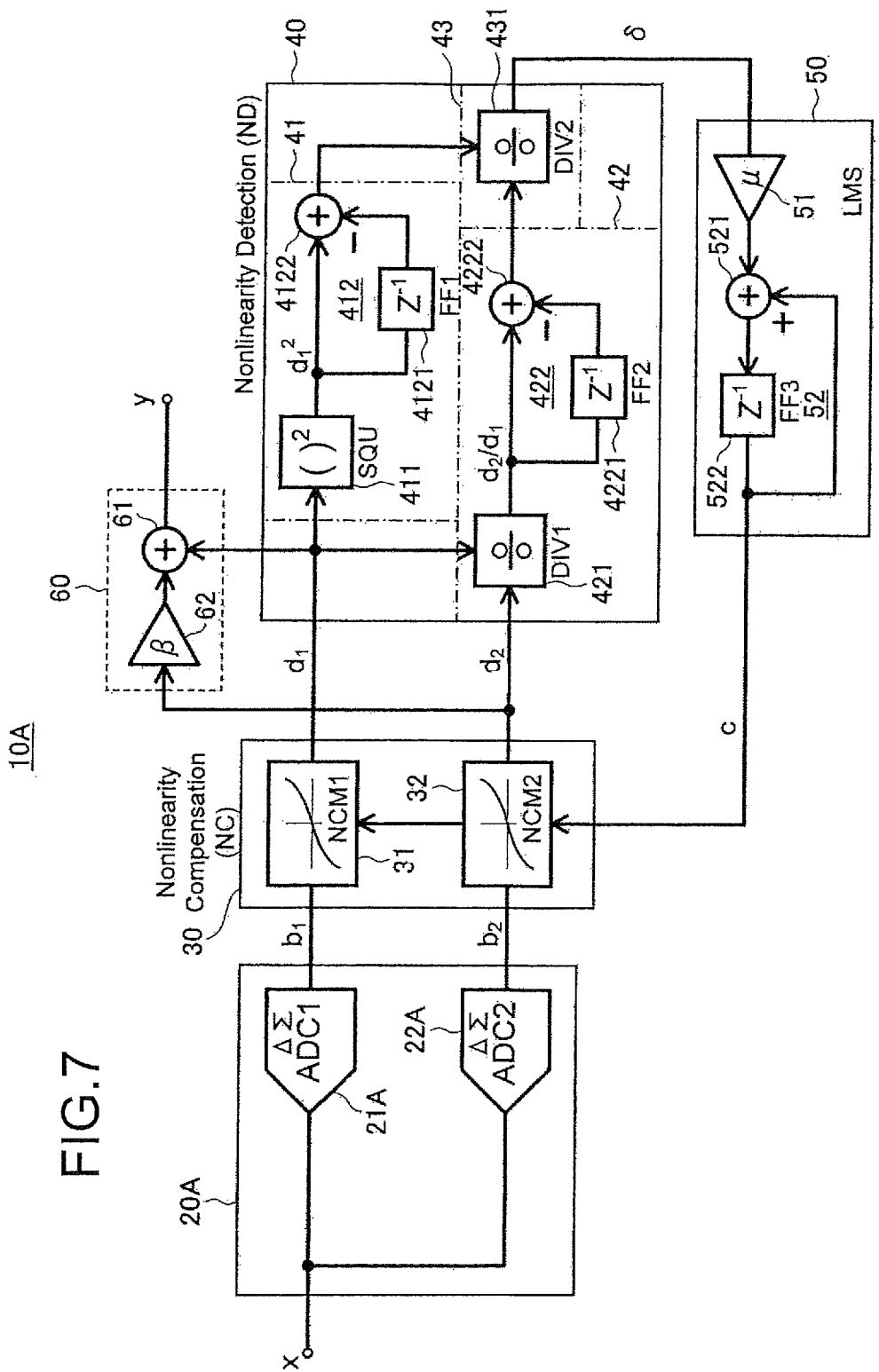
FIG. 7 is a diagram showing a structure of an AD conversion apparatus that includes a non-linear (distortion) compensation function according to a second embodiment.

FIG. 7 is a diagram showing a structure of an AD conversion apparatus that includes a non-linear (distortion) compensation function according to the second embodiment.

An AD conversion apparatus 10A according to the second embodiment is different from the AD conversion apparatus 10 in the first embodiment in a point in which ΔΣ-type AD converters having a continuous-time system are applied as a first AD converter 21A and a second AD converter 22A in an AD conversion part 20A.

The AD conversion part 20A according to the second embodiment shares the gain imparting circuit 23 in input parts of the AD converters.

In the second embodiment, an input resistance $R_{in}$ in an input part of the first AD converter 21A has a value different from that in an input part of the second AD converter 22A.

In this embodiment, the input resistance of the second AD converter 22A has a value set by multiplying a value of the input resistance of the first AD converter 21A by $(1/\alpha)$ times.

Figure 8:
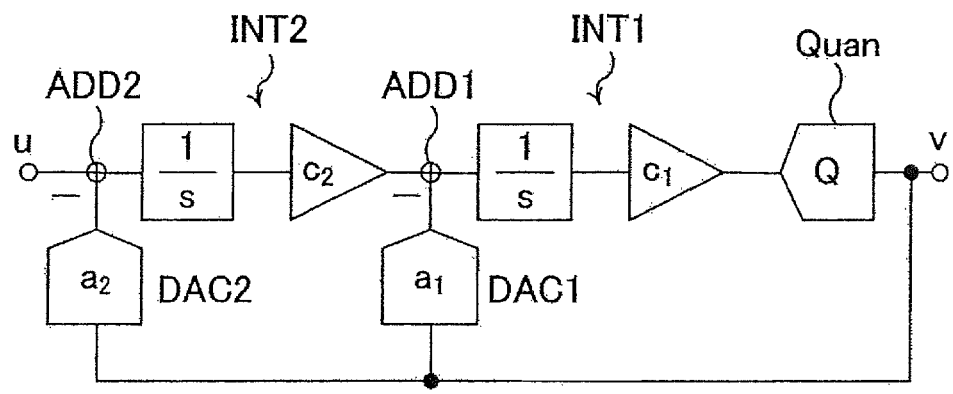
FIG. 8 is a circuit diagram showing a structure example of a ΔΣ modulator as a ΔΣ-type AD converter in FIG. 7.

FIG. 8 is a circuit diagram showing a structure example of a $\Delta\Sigma$ modulator as the $\Delta\Sigma$-type AD converter in FIG. 7.

A $\Delta\Sigma$ modulator 200 in FIG. 8 is formed as a continuous-time system second-order 1-bit feedback-type $\Delta\Sigma$ modulator.

The $\Delta\Sigma$ modulator 200 in FIG. 8 includes integrators INT1 and INT2, a quantizer Quan, adders ADD1 and ADD2, and digital-to-analog (DA) converters DAC1 and DAC2.

In FIG. 8, u represents an analog input signal and v represents a digital output signal. Also, $a_1$ and $a_2$ represent feedback gains of the DA converters DAC1 and DAC2 respectively, and $c_1$ and $c_2$ represent gains of the integrators INT1 and INT2. Q represents an effective gain of the quantizer Quan.

A noise transmission function (NTF) for v of quantization noise generated in the quantizer Quan shows high-pass-type frequency characteristics.

This means that noise shaping is performed on the quantization noise generated in the quantizer Quan due to a feedback effect in the $\Delta\Sigma$ modulator 200, resulting in a high SN ratio in a signal band by movement to a high frequency region.

Figure 9:
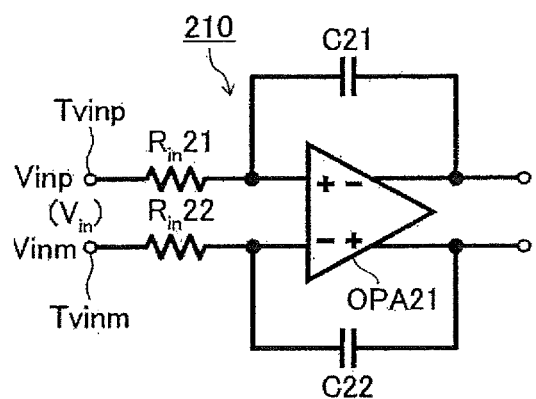
FIG. 9 is a diagram showing a structure example of an input part of the ΔΣ modulator in FIG. 8.

FIG. 9 is a diagram showing a structure example of an input part of the $\Delta\Sigma$ modulator in FIG. 8.

An input part 210 of the $\Delta\Sigma$ modulator 200 in FIG. 9 is structured as a circuit configured to receive a differential input signal.

For example, in an AD converter such as a continuous-time $\Delta\Sigma$ modulator (AD converter), the input part 210 thereof has a structure as shown in FIG. 9.

The input part 210 includes input resistances $R_{in}21$ and $R_{in}22$, capacitances C21 and C22, and an operation amplifier OPA21 for differential input/output.

Also, the input part 210 includes a first analog signal input terminal $T_{Vinp}$ and a second analog signal input terminal $T_{Vinm}$.

The structure corresponds to a part of the integrator INT2 in FIG. 8.

Though a feedback route including a load resistance from DAC2 is omitted in FIG. 9, a feedback route including a load resistance is practically connected on an input side of the operation amplifier OPA21.

The first analog signal input terminal $T_{Vinp}$ is connected to a positive side input terminal (represented by plus sign) of the operation amplifier OPA21 through the input resistance $R_{in}21$.

The second analog signal input terminal $T_{Vinm}$ is connected to a negative side input terminal (represented by minus sign) of the operation amplifier OPA21 through the input resistance $R_{in}22$.

The capacitance C21 is connected between the negative side output terminal (represented by minus sign) and the positive side input terminal (represented by plus sign) of the operation amplifier OPA21.

The capacitance C22 is connected between the positive side output terminal (represented by plus sign) and the negative side output terminal (represented by minus sign) of the operation amplifier OPA21.

A gain in the circuit is determined by a ratio of the resistance and capacitance. Therefore, in the structure, the input resistances $R_{in}21$ and $R_{in}22$ of the second AD converter 22A have values set by multiplying values of the first AD converter 21A by $(1/\alpha)$ times. It realizes the constant gain $\alpha$ in a form combined with an AD converter.

According to the second embodiment, a similar effect to that of the above-mentioned first embodiment may be acquired.

3. Third Embodiment

Figure 10:
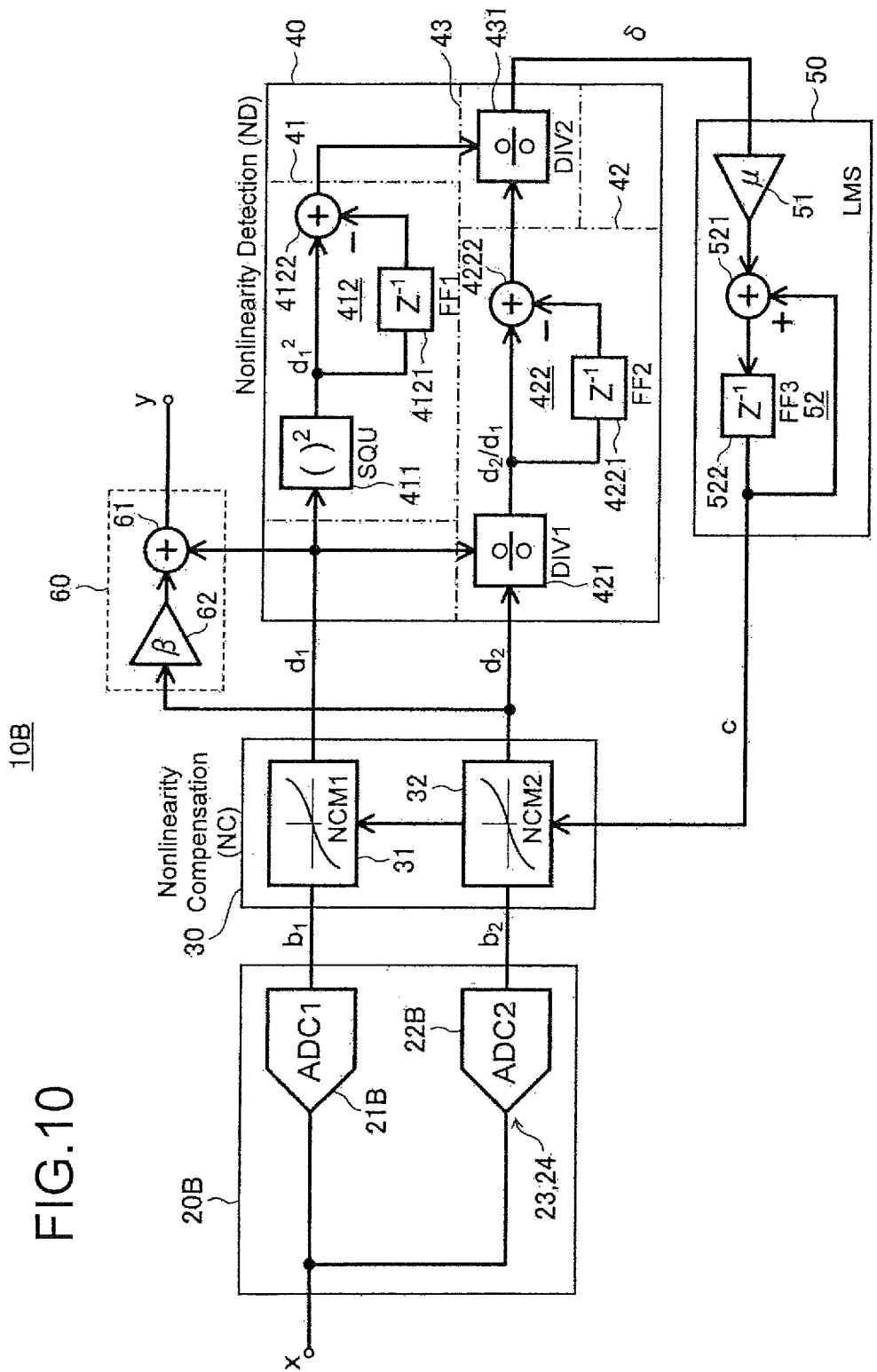
FIG. 10 is a diagram showing a structure of an AD conversion apparatus that includes a non-linear (distortion) compensation function according to a third embodiment.

FIG. 10 is a diagram showing a structure of an AD conversion apparatus that includes a non-linear (distortion) compensation function according to the third embodiment.

An AD conversion apparatus 10B according to the third embodiment is different from the AD conversion apparatus 10A in the second embodiment in a point in which filter circuits (FLT) 24 having a continuous-time system are applied in input parts of a first AD converter 21B and a second AD converter 22B in an AD conversion part 20B.

The AD conversion part 20B according to the third embodiment shares the gain imparting circuit 23 and the filter circuit 24 in the input parts of the AD converters.

In the third embodiment, the input resistance $R_{in}$ in the input part of the first AD converter 21B has a value different from that in the input part of the second AD converter 22B.

In this embodiment, the input resistance in the filter circuit of the second AD converter 22B has a value set by multiplying a value of the input resistance of the first AD converter 21B by $(1/\alpha)$ times.

FIGS. 11A and 11B are diagrams showing a structure example of an input part of a $\Delta\Sigma$ modulator according to the third embodiment.

An input part 210B in FIG. 11 is different from the input part in FIG. 10 in a point in which resistances R21 and R22 are respectively connected to the capacitances C21 and C22 in parallel.

In many cases, as shown in FIG. 11A, the continuous-time filter circuit 24 exists in a preceding stage of an AD converter. The continuous-time filter circuit 24 includes, as shown in FIG. 11B, the resistances R21 and R22, the capacitances C21 and C22, and the operation amplifier OPA21.

A gain of the circuit is determined by a ratio of the input resistances $R_{in}21$ and $R_{in}22$, the resistances R21 and R22, and the capacitances C21 and C22.

Therefore, in the structure, the input resistance $R_{in}$ in the second filter circuit in a preceding stage of the second AD converter 22B has a value set by multiplying a value of the first AD converter 21B by $(1/\alpha)$ times. It realizes the constant gain $\alpha$ in a form combined with a filter in a preceding stage of the AD converter.

According to the third embodiment, a similar effect to that of the first and second embodiments mentioned above may be acquired.

4. Fourth Embodiment

Figure 12:
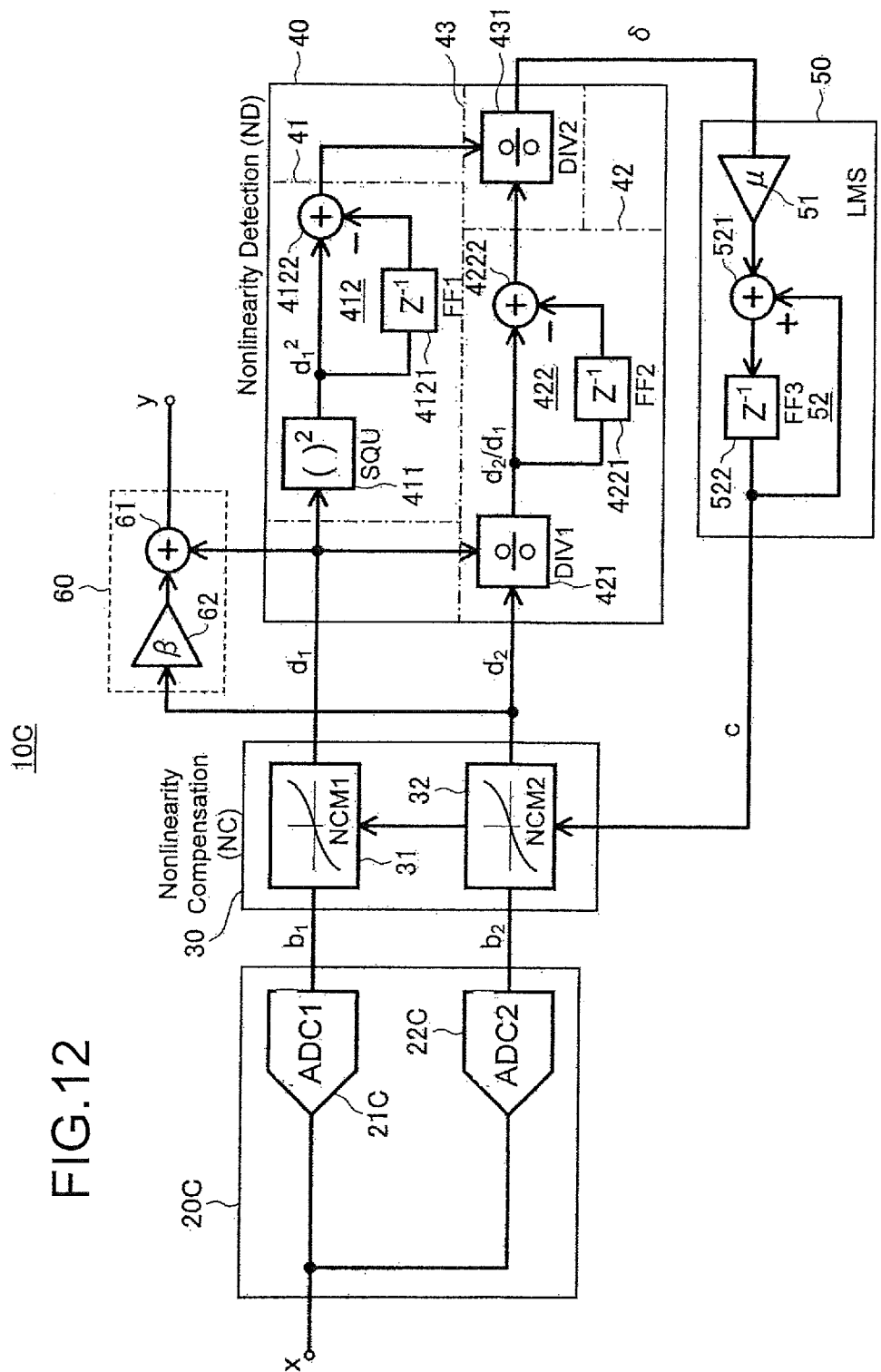
FIG. 12 is a diagram showing a structure of an AD conversion apparatus that includes a non-linear (distortion) compensation function according to a fourth embodiment.

FIG. 12 is a diagram showing a structure of an AD conversion apparatus that includes a non-linear (distortion) compensation function according to the fourth embodiment.

An AD conversion apparatus 10C according to the fourth embodiment is different from the AD conversion apparatus 10 in the first embodiment in a point in which pipeline-type AD converters are applied as a first AD converter 21C and a second AD converter 22C.

As mentioned below, multiplication of a gain performed on an input signal of the second AD converter 22C is realized by varying an input value of the pipeline-type AD converter.

In the AD conversion apparatus 10C according to the fourth embodiment, values are different between an input capacitance of the first AD converter 21C and an input capacitance of the second AD converter 22C.

In this embodiment, the input capacitance of the second AD converter 22C has a value set by multiplying a value of the input capacitance of the first AD converter 21C by α times.

Figure 13:
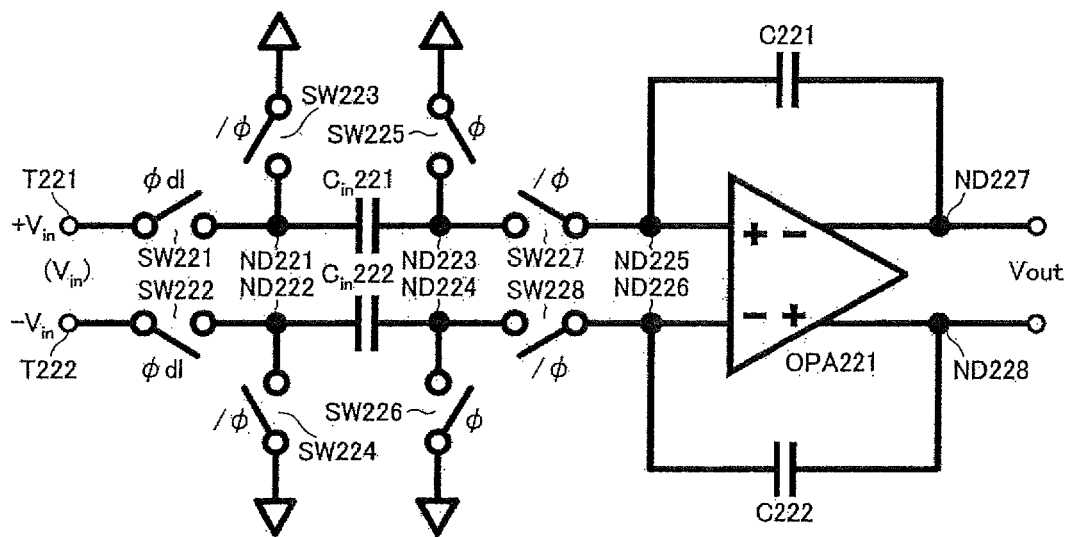
FIG. 13 are circuit diagrams showing a structure example of an input part of a pipeline-type AD converter in FIG. 12.

FIG. 13 is a circuit diagram showing a structure example of an input part of the pipeline-type AD converter in FIG. 12.

An input-stage circuit 220 in FIG. 13 includes an operation amplifier OPA221, capacitances C221 and C222, and sampling capacitances $C_{in}221$ and $C_{in}222$.

The input-stage circuit 220 includes input terminals T221 and T222 of differential input voltages $+V_{in}$ and $-V_{in}$, switches SW221 to SW228, and nodes ND221 to ND228.

The sampling capacitance $C_{in}221$ is connected between the node ND221 and the node ND223, and the sampling capacitance $C_{in}222$ is connected between the node ND222 and the node ND224.

The capacitance C221 is connected between the first input-side node ND225 and the first output-side node ND227 of the operation amplifier OPA221. The capacitance C222 is connected between the second input-side node ND226 and the second output-side node ND228 of the operation amplifier OPA221.

The switch SW221 is connected between the input terminal T221 and the node ND221, and is switched ON/OFF by a signal Φd1. The switch SW222 is connected between the input terminal T222 and the node ND222, and is switched ON/OFF by the signal Φd1.

The switch SW223 is connected between the node ND221 and the reference potential, and is switched ON/OFF by an inversion signal /Φ (/ represents inversion) of a signal Φ.

The switch SW224 is connected between the node ND222 and the reference potential, and is switched ON/OFF by the inversion signal /Φ of the signal Φ.

The switch SW225 is connected between the node ND223 and the reference potential, and is switched ON/OFF by the signal Φ.

The switch SW226 is connected between the node ND224 and the reference potential, and is switched ON/OFF by the signal Φ.

The switch SW227 is connected between the node ND223 and the node ND225, and is switched ON/OFF by the inversion signal /Φ of the signal Φ.

The switch SW228 is connected between the node ND224 and the node ND226, and is switched ON/OFF by the inversion signal /Φ of the signal Φ.

The sampling capacitance $C_{in}221$ samples an input voltage $V_{in}$ in an ON state of the switch SW225, and generates the sampled voltage $V_{in}$ on the node ND223 side to output a voltage signal thereof in an OFF state of the switch SW225.

The sampling capacitance $C_{in}222$ samples an input voltage $-V_{in}$ in an ON state of the switch SW226, and generates the sampled voltage $-V_{in}$ on the node ND224 side to output a voltage signal thereof in an OFF state of the switch SW226.

For example, in an AD converter such as a pipeline-type AD converter and a discrete-time ΔΣ AD converter, an input part thereof may be structured as shown in FIG. 13, and includes capacitances, switches, and the operation amplifier OPA221.

A gain of the circuit is determined by a ratio of capacitances.

Therefore, in the structure, the input capacitances $C_{in}221$ and $C_{in}222$ of the second AD converter 22C have values set by multiplying values of the first AD converter 21C by α times, and the constant gain α is realized in a form combined with an AD converter.

According to the fourth embodiment, a similar effect to that of the above-mentioned first embodiment may be acquired.

5. Fifth Embodiment

Figure 14:
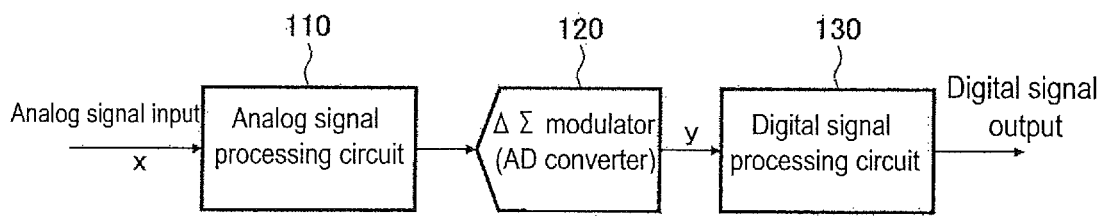
FIG. 14 is a block diagram showing a structure example of a signal processing system according to a fifth embodiment.

FIG. 14 is a block diagram showing a structure example of a signal processing system according to the fifth embodiment.

A signal processing system 100 is formed as a signal processing system applicable to the AD conversion apparatuses 10 to 100 according to the first to fourth embodiments. As an example of the signal processing system 100, a signal processing system for a receiving device of communication equipment is illustrated.

The signal processing system 100 includes an analog signal processing circuit 110, an AD converter 120, and a digital signal processing circuit 130.

In the signal processing system 100, any one of the AD conversion apparatuses 10 to 10C according to the first to fourth embodiments is applicable as the AD converter 120.

In the signal processing system 100 in FIG. 14, size reduction and high efficiency are expected by performing signal processing with the digital signal processing circuit 130 as much as possible to reduce a scale of the analog signal processing circuit 110.

In order to realize a system as mentioned above, that is, to perform signal processing with the digital signal processing circuit 130 instead of the analog signal processing circuit 110 that has performed the signal processing in related art, AD conversion should be performed with information loss of original signals as least as possible. Therefore, an AD converter having a high SN ratio is favorable.

In order to realize a higher SN ratio, there are two conditions that should be met: <1> to increase resolution (the number of bits); and <2> to reduce noise in a circuit. Also, an AD converter should have a high conversion speed. This is because an information amount to be handled has increased with the sophistication of a system.

As an example of the AD converter 120 that meets these conditions, the AD conversion apparatus 10C according to the fourth embodiment, which functions as a pipeline-type AD converter, is applicable.

In the embodiments mentioned above, both single operation and differential operation are applicable.

The present technology may also provide a structure as described below.

(1) An analog-to-digital conversion apparatus including:

a first analog-to-digital converter configured to convert an input analog signal into a digital signal;

a second analog-to-digital converter configured to convert an analog signal generated by multiplying the input analog signal by α times with a coefficient α into a digital signal;

a first non-linear compensation part configured to compensate a non-linear distortion of a first output signal of the first analog-to-digital converter depending on a control variable signal to be supplied;

a second non-linear compensation part configured to compensate a non-linear distortion of a second output signal of the second analog-to-digital converter depending on the control variable signal to be supplied; and a non-linear detection part configured to estimate how much the non-linear distortion of the first analog-to-digital converter and that of the second analog-to-digital converter are compensated by the first non-linear compensation part and the second non-linear compensation part depending on a first signal by the first non-linear compensation part and a second signal by the second non-linear compensation part, the non-linear detection part being configured to estimate a curvature that depends on a signal intensity of the input analog signal on the basis of a ratio of a change generated by the first signal and the second signal with a non-linear distortion as the curvature and generate the control variable signal to negate the curvature portion to thereby output the control variable signal to the first non-linear compensation part and the second non-linear compensation part.

(2) The analog-to-digital conversion apparatus according to (1), in which the non-linear detection part includes an intensity acquisition part configured to calculate the signal intensity of the input analog signal on the basis of the first signal, a curvature acquisition part configured to acquire the curvature that depends on the signal intensity of the input analog signal on the basis of a ratio of a change generated by dividing the second signal by the first signal, and a control variable generation part configured to generate the control variable signal depending on the curvature acquired by the curvature acquisition part and the signal intensity acquired by the intensity acquisition part.

(3) The analog-to-digital conversion apparatus according to (2), in which the intensity acquisition part includes an absolute value acquisition part configured to acquire an absolute value signal of the first signal, and a first differentiator configured to differentiate the absolute value signal acquired by the absolute value acquisition part to acquire the signal intensity of the input analog signal, the curvature acquisition part includes a first divider configured to divide the second signal by the first signal to acquire a variable ratio signal, and a second differentiator configured to differentiate the variable ratio signal acquired by the first divider to acquire a curvature that depends on the signal intensity of the input analog signal, and the control variable generation part includes a second divider configured to divide the curvature acquired by the second differentiator by the signal intensity output by the first differentiator to generate the control variable signal.

(4) The analog-to-digital conversion apparatus according to any one of (1) to (3), further including a filter configured to perform filtering processing on the control variable signal output from the non-linear detection part to supply a resultant signal to the first non-linear compensation part and the second non-linear compensation part as a control variable signal that does not depend on noise.

(5) The analog-to-digital conversion apparatus according to any one of (1) to (4), further including an output part configured to add the first signal by the first non-linear compensation part and the second signal by the second non-linear compensation part to output a resultant signal.

(6) The analog-to-digital conversion apparatus according to (5), in which the output part adds a signal generated by multiplying the second signal by the second non-linear compensation part by $\beta$ times with a weight coefficient $\beta$ and the first signal to output a resultant signal.

(7) The analog-to-digital conversion apparatus according to any one of (1) to (6), in which the first analog-to-digital converter and the second analog-to-digital converter are each formed by a $\Delta\Sigma$ modulator, the $\Delta\Sigma$ modulator including at least one integrator, a quantizer including an integration capacitance and configured to quantize an output signal of the integrator to output a digital signal, at least one digital-to-analog converter configured to convert the digital signal by the quantizer into an analog signal to feed back the analog signal to an input side of the integrator, and an input resistance to which an input signal is input, and values are different between an input resistance of the first analog-to-digital converter and an input resistance of the second analog-to-digital converter.

(8) The analog-to-digital conversion apparatus according to (7), in which the value of the input resistance of the second analog-to-digital converter is set by multiplying the value of the input resistance of the first analog-to-digital converter by $(1/\alpha)$ times.

(9) The analog-to-digital conversion apparatus according to any one of (1) to (6), in which the first analog-to-digital converter and the second analog-to-digital converter are formed by pipeline-type analog-to-digital converters that include input capacitances to sample an input signal in an input stage, and values are different between the input capacitance of the first analog-to-digital converter and the input capacitance of the second analog-to-digital converter.

(10) The analog-to-digital conversion apparatus according to (9), in which the value of the input capacitance of the second analog-to-digital converter is set by multiplying the value of the input capacitance of the first analog-to-digital converter by $\alpha$ times.

(11) A signal processing system, including an analog-to-digital conversion apparatus configured to convert an analog signal from an analog signal processing system into a digital signal, the analog-to-digital conversion apparatus including a first analog-to-digital converter configured to convert an input analog signal into a digital signal, a second analog-to-digital converter configured to convert an analog signal generated by multiplying the input analog signal by $\alpha$ times with a coefficient $\alpha$ into a digital signal, a first non-linear compensation part configured to compensate a non-linear distortion of a first output signal of the first analog-to-digital converter depending on a control variable signal to be supplied, a second non-linear compensation part configured to compensate a non-linear distortion of a second output signal of the second analog-to-digital converter depending on the control variable signal to be supplied, and a non-linear detection part configured to estimate how much the non-linear distortion of the first analog-to-digital converter and that of the second analog-to-digital converter are compensated by the first non-linear compensation part and the second non-linear compensation part depending on a first signal by the first non-linear compensation part and a second signal by the second non-linear compensation part, the non-linear detection part being configured to estimate a curvature that depends on a signal intensity of the input analog signal on the basis of a ratio of a change generated by the first signal and the second signal with a non-linear distortion as the curvature and generate the control variable signal to negate the curvature portion to thereby output the control variable signal to the first non-linear compensation part and the second non-linear compensation part.

The present disclosure contains subject matter related to that disclosed in Japanese Priority Patent Application JP 2011-121911 filed in the Japan Patent Office on May 31, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An analog-to-digital conversion apparatus comprising:
a first analog-to-digital converter configured to convert an input analog signal into a digital signal;
a second analog-to-digital converter configured to convert an analog signal generated by multiplying the input analog signal by α times with a coefficient α into a digital signal;
a first non-linear compensation part configured to compensate a non-linear distortion of a first output signal of the first analog-to-digital converter depending on a control variable signal to be supplied;
a second non-linear compensation part configured to compensate a non-linear distortion of a second output signal of the second analog-to-digital converter depending on the control variable signal to be supplied; and
a non-linear detection part configured to estimate how much the non-linear distortion of the first analog-to-digital converter and that of the second analog-to-digital converter are compensated by the first non-linear compensation part and the second non-linear compensation part depending on a first signal by the first non-linear compensation part and a second signal by the second non-linear compensation part, the non-linear detection part being configured to estimate a curvature that depends on a signal intensity of the input analog signal on the basis of a ratio of a change generated by the first signal and the second signal with a non-linear distortion as the curvature and generate the control variable signal to negate the curvature portion to thereby output the control variable signal to the first non-linear compensation part and the second non-linear compensation part.

2. The analog-to-digital conversion apparatus according to claim 1, wherein
the non-linear detection part includes
an intensity acquisition part configured to calculate the signal intensity of the input analog signal on the basis of the first signal,
a curvature acquisition part configured to acquire the curvature that depends on the signal intensity of the input analog signal on the basis of a ratio of a change generated by dividing the second signal by the first signal, and
a control variable generation part configured to generate the control variable signal depending on the curvature acquired by the curvature acquisition part and the signal intensity acquired by the intensity acquisition part.

3. The analog-to-digital conversion apparatus according to claim 2, wherein
the intensity acquisition part includes
an absolute value acquisition part configured to acquire an absolute value signal of the first signal, and
a first differentiator configured to differentiate the absolute value signal acquired by the absolute value acquisition part to acquire the signal intensity of the input analog signal,
the curvature acquisition part includes
a first divider configured to divide the second signal by the first signal to acquire a variable ratio signal, and
a second differentiator configured to differentiate the variable ratio signal acquired by the first divider to acquire a curvature that depends on the signal intensity of the input analog signal, and
the control variable generation part includes
a second divider configured to divide the curvature acquired by the second differentiator by the signal intensity output by the first differentiator to generate the control variable signal.

4. The analog-to-digital conversion apparatus according to claim 1, further comprising
a filter configured to perform filtering processing on the control variable signal output from the non-linear detection part to supply a resultant signal to the first non-linear compensation part and the second non-linear compensation part as a control variable signal that does not depend on noise.

5. The analog-to-digital conversion apparatus according to claim 1, further comprising
an output part configured to add the first signal by the first non-linear compensation part and the second signal by the second non-linear compensation part to output a resultant signal.

6. The analog-to-digital conversion apparatus according to claim 5, wherein
the output part
adds a signal generated by multiplying the second signal by the second non-linear compensation part by β times with a weight coefficient β and the first signal to output a resultant signal.

7. The analog-to-digital conversion apparatus according to claim 1, wherein
the first analog-to-digital converter and the second analog-to-digital converter are each formed by a ΔΣ modulator,
the ΔΣ modulator including
at least one integrator,
a quantizer including an integration capacitance and configured to quantize an output signal of the integrator to output a digital signal,
at least one digital-to-analog converter configured to convert the digital signal by the quantizer into an analog signal to feed back the analog signal to an input side of the integrator, and
an input resistance to which an input signal is input, and
values are different between an input resistance of the first analog-to-digital converter and an input resistance of the second analog-to-digital converter.

8. The analog-to-digital conversion apparatus according to claim 7, wherein
the value of the input resistance of the second analog-to-digital converter is set by multiplying the value of the input resistance of the first analog-to-digital converter by (1/α) times.

9. The analog-to-digital conversion apparatus according to claim 1, wherein
the first analog-to-digital converter and the second analog-to-digital converter are formed by pipeline-type analog-to-digital converters that include input capacitances to sample an input signal in an input stage, and values are different between the input capacitance of the first analog-to-digital converter and the input capacitance of the second analog-to-digital converter.

10. The analog-to-digital conversion apparatus according to claim 9, wherein
the value of the input capacitance of the second analog-to-digital converter is set by multiplying the value of the input capacitance of the first analog-to-digital converter by $\alpha$ times.

11. A signal processing system, comprising
an analog-to-digital conversion apparatus configured to convert an analog signal from an analog signal processing system into a digital signal, the analog-to-digital conversion apparatus including
a first analog-to-digital converter configured to convert an input analog signal into a digital signal,
a second analog-to-digital converter configured to convert an analog signal generated by multiplying the input analog signal by $\alpha$ times with a coefficient $\alpha$ into a digital signal,
a first non-linear compensation part configured to compensate a non-linear distortion of a first output signal of the first analog-to-digital converter depending on a control variable signal to be supplied,
a second non-linear compensation part configured to compensate a non-linear distortion of a second output signal of the second analog-to-digital converter depending on the control variable signal to be supplied, and
a non-linear detection part configured to estimate how much the non-linear distortion of the first analog-to-digital converter and that of the second analog-to-digital converter are compensated by the first non-linear compensation part and the second non-linear compensation part depending on a first signal by the first non-linear compensation part and a second signal by the second non-linear compensation part, the non-linear detection part being configured to estimate a curvature that depends on a signal intensity of the input analog signal on the basis of a ratio of a change generated by the first signal and the second signal with a non-linear distortion as the curvature and generate the control variable signal to negate the curvature portion to thereby output the control variable signal to the first non-linear compensation part and the second non-linear compensation part.

* * * * *